(12) United States Patent
Chi

(10) Patent No.: US 6,759,699 B1
(45) Date of Patent: Jul. 6, 2004

(54) STORAGE ELEMENT AND SRAM CELL STRUCTURES USING VERTICAL FETS CONTROLLED BY ADJACENT JUNCTION BIAS THROUGH SHALLOW TRENCH ISOLATION

(75) Inventor: Min-Hwa Chi, Hsin-chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 27 days.

(21) Appl. No.: 10/420,263

(22) Filed: Apr. 22, 2003

(51) Int. Cl.[7] .............................................. H01L 29/72
(52) U.S. Cl. ..................... 257/288; 257/296; 257/329; 257/331; 257/334
(58) Field of Search ............................... 257/288, 296, 257/350, 329, 331, 334, 302, 135, 776, 66; 438/217, 265, 305, 243, 386

(56) References Cited

U.S. PATENT DOCUMENTS

| | | | | |
|---|---|---|---|---|
| 4,890,144 A | * | 12/1989 | Teng et al. ..................... 257/66 |
| 5,521,115 A | * | 5/1996 | Park et al. .................... 438/243 |
| 6,033,943 A | * | 3/2000 | Gardner ........................ 438/199 |
| 6,117,722 A | * | 9/2000 | Wuu et al. .................... 438/238 |
| 6,124,177 A | * | 9/2000 | Lin et al. ..................... 438/305 |
| 6,137,129 A | * | 10/2000 | Bertin et al. ................. 257/302 |
| 6,157,064 A | * | 12/2000 | Huang .......................... 257/344 |
| 6,297,531 B2 | * | 10/2001 | Armacost et al. ............ 257/329 |
| 6,313,490 B1 | * | 11/2001 | Noble .......................... 257/288 |
| 6,333,533 B1 | * | 12/2001 | Furukawa et al. ........... 257/301 |
| 6,441,421 B1 | * | 8/2002 | Clevenger et al. ........... 257/296 |
| 6,451,679 B1 | * | 9/2002 | Hu et al. ...................... 438/592 |
| 6,468,915 B1 | * | 10/2002 | Liu .............................. 438/706 |
| 6,627,502 B1 | * | 9/2003 | Cho ............................. 438/265 |
| 6,649,461 B1 | * | 11/2003 | Lai et al. ..................... 438/217 |

* cited by examiner

*Primary Examiner*—Michael S. Lebentritt
(74) *Attorney, Agent, or Firm*—George O. Saile; Stephen B. Ackerman; Douglas R. Schnabel

(57) ABSTRACT

A new digital follower device is achieved. The digital follower device comprises an n-channel vertical FET device and a p-channel vertical FET device. Each vertical FET device comprises a bulk region in a semiconductor substrate. The bulk region comprises a first doping type. A STI region is in the bulk region. A drain region is on a first side of the STI region. The drain region overlies the bulk region. The drain region comprises the first doping type. A gate region is on a second side of the STI region. The gate region comprises the first doping type. A voltage on the gate region controls a vertical channel in the bulk region. A buried region is between the gate region and the bulk region. The buried region comprises a second doping type. The n-channel FET device drain and the p-channel FET device drain are connected together. The n-channel FET device, gate and the p-channel FET device gate are connected together.

7 Claims, 16 Drawing Sheets

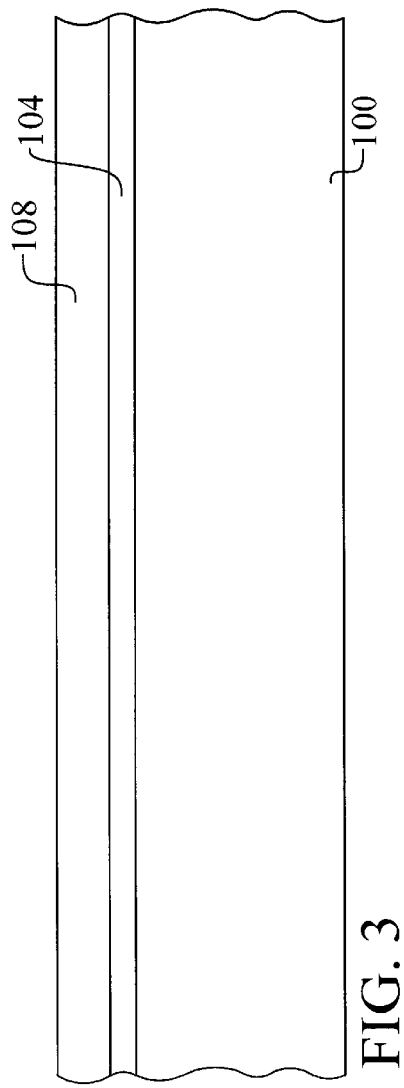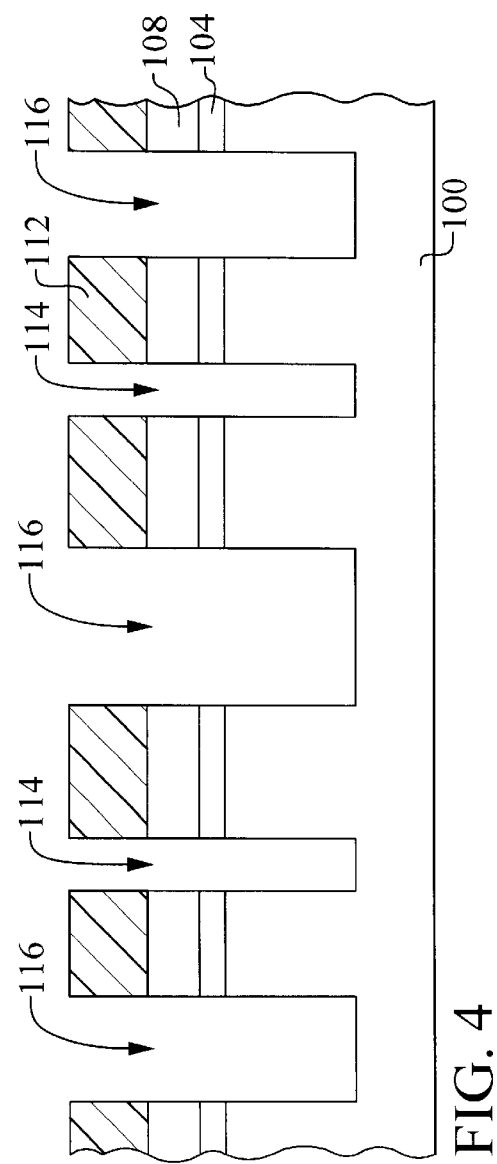

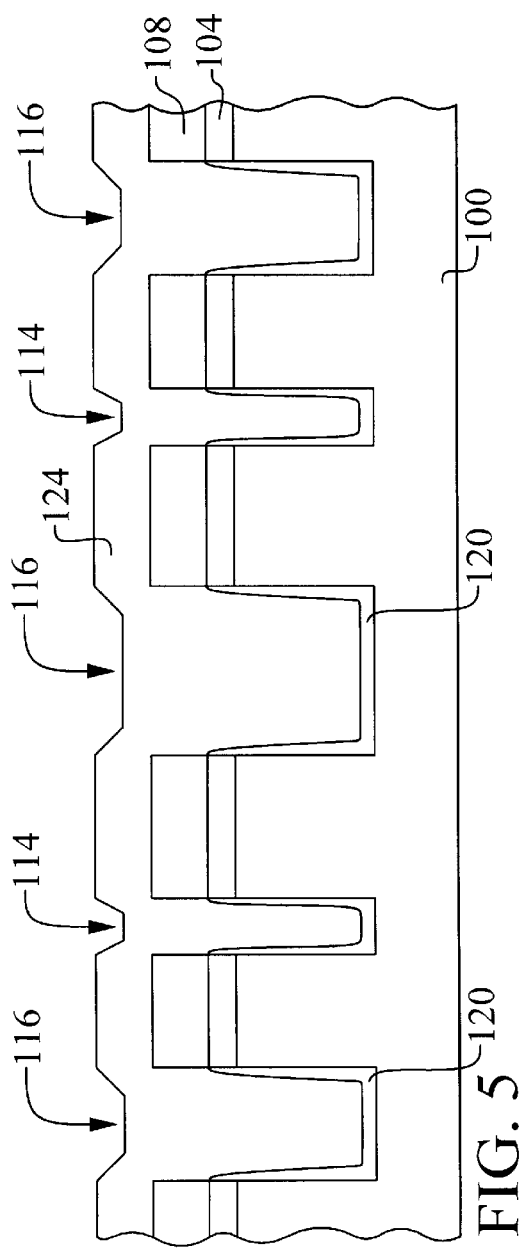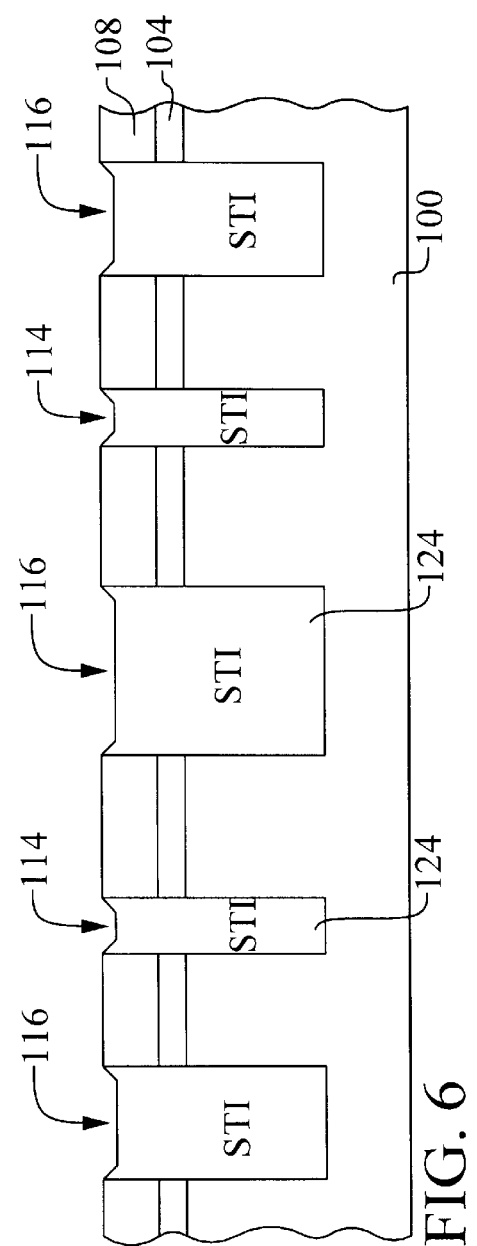

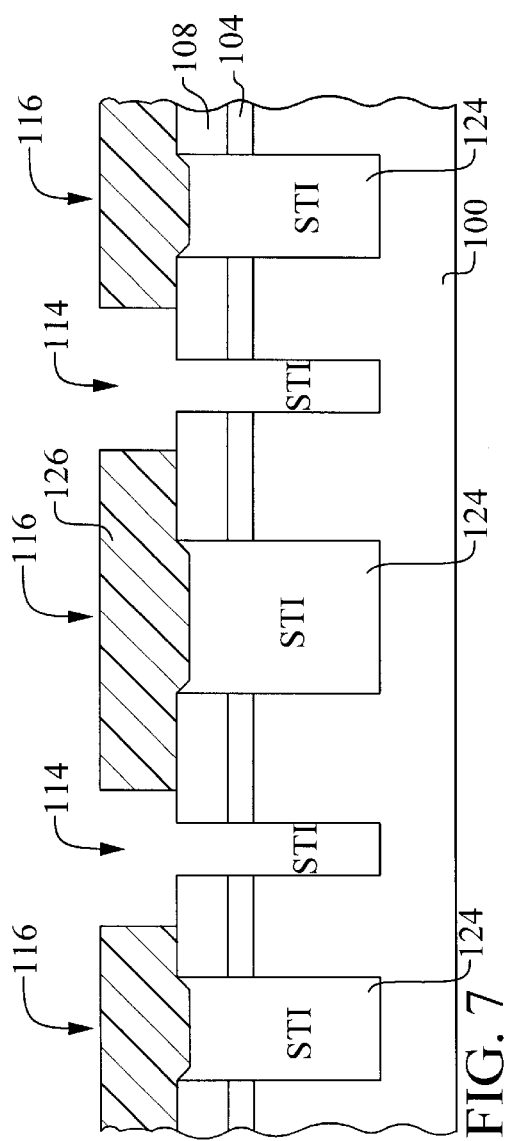
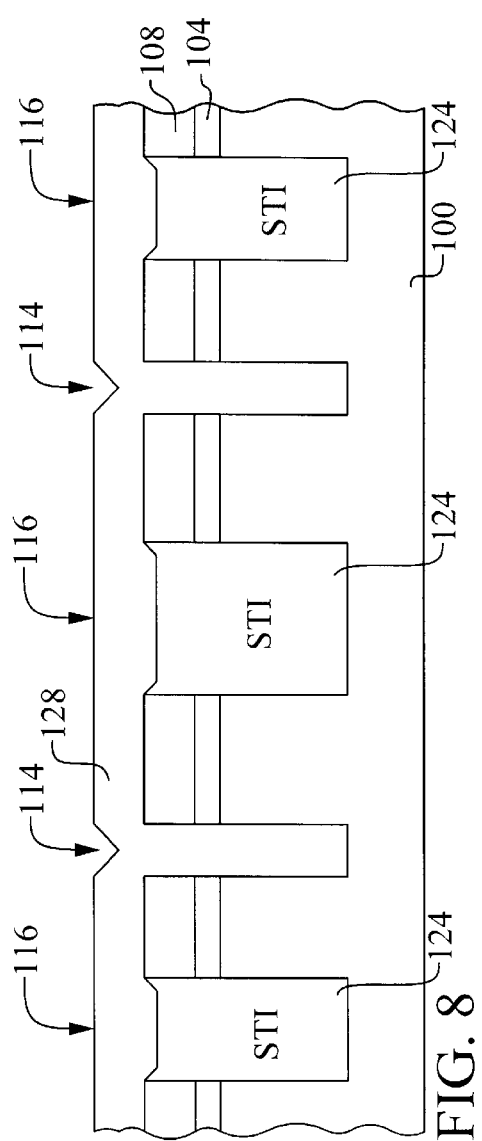

STORAGE ELEMENT AND SRAM CELL STRUCTURES USING VERTICAL FETS CONTROLLED BY ADJACENT JUNCTION BIAS THROUGH SHALLOW TRENCH ISOLATION

BACKGROUND OF THE INVENTION (1) Field of the Invention

The invention relates to memory devices, and, more particularly, to a memory device based on vertical FET devices in an integrated circuit device.

(2) Description of the Prior Art

Memory devices are very important in the art of digital electronics. Memory devices are used to store software programs and processed data. Write capable memory, such as RAM, is particularly important for storing data. Static RAM, or SRAM, is of particular importance in the present invention. In a SRAM device, data written to a memory cell can be stored indefinitely as long as,power is supplied to the cell. Further, the stored data can be changed by rewriting the cell. However, unlike a dynamic RAM, or DRAM, the data value does not have to be periodically refreshed.

Referring now to FIG. 1, a typical SRAM cell 10 is shown in schematic form. The SRAM cell 10 comprises six MOS transistors and is therefore called a 6T cell. In particular, the cell comprises NMOS transistors N1 34 and N2 42, PMOS transistors P1 30 and P2 38, and NMOS transistors S1 46 and S2 50. Transistor pairs N1 34 and P1 30 form a first inverter and N2 42 and P2 38 form a second inverter. Note that the input of the first inverter 30 and 34 is coupled to the output of the second inverter 38 and 42. Similarly, the input of the second inverter 38 and 42 is coupled to the output of the first inverter 30 and 34. In this arrangement, a digital latch is formed. The digital latch 30, 34, 38, and 42, has two key nodes A 35 and B 43. The digital latch is electrically able to maintain either of two states. In one state, A is high and B is low. In the other state, A is low and B is high.

Transistors S1 46 and S2 50 are used to control access to the digital latch 30, 34, 38, and 42. The access transistors 46 and 50 are controlled by a common signal, called a word line (WL) 20. When WL is asserted, the access transistors 46 and 50 are ON. In this state, the bit line (BL) 22 is coupled to node A 35, and the bit line bar (BLB) is coupled to node B. If the WL assertion is due to a READ of the cell 10, then the BL 22 and BLB 26 signal lines will be coupled to a high impedance input stage of a bit line amplifier, not shown. This amplifier will be used to read the voltage state (high or low) of the BL 22 and BLB 26 signals to thereby determine the stored state of the cell 10. If the WL 20 assertion is due to a WRITE operation, then the BL 22 and BLB 26 signals will be driven to opposite voltages (VCC and VSS) by the writing circuit. This will force the digital latch nodes A 35 and B 43 to the proper write state. When WL 20 is de-asserted, the access transistors S1 46 and S2 50 are turned OFF, and the write state is held in the digital latch.

The SRAM cell 10 has several advantages. First, the standby current of the cell is quite low due the complimentary MOS (CMOS) devices. A current path from VCC 14 to VSS 18 exists only during switching. Second, a large number of cells 10 can be designed into a memory array such that a large amount of data can be stored. Any cell in the array can be accessed by an addressing scheme as is well known in the art. In should be noted, however, that the SRAM cell 10 requires six transistors to store a single bit of data.

Referring now to FIG. 2, a top layout view of the SRAM cell 10 is shown. Several integrated circuit layers are shown in this simplified layout. In particular, n-type active areas 64 and p-type active areas 60 are shown. A polysilicon level 68, a metal level 72, and a contact level 76 are also shown. As is well known in the art of MOS integrated circuit fabrication, MOS transistors are formed where the polysilicon level 68 crosses the active areas 60 or 64. In particular, the PMOS transistors P1 30 and P2 38 are formed where the polysilicon level 68 crosses the p-type active area 60. The NMOS transistors N1 34, N2 42, S1 46, and S2 50, are formed where the polysilicon level 68 crosses the n-type active area 64. Contact openings 76 are formed in a conformal dielectric layer. The metal level 72 connects elements though the contact openings 76.

Several facts should be noted with regard to the typical CMOS SRAM cell shown. First, the MOS devices are formed on the surface of the integrated circuit wafer. It is found in the art that most integration effort is devoted to reducing the sizes of surface features (line widths and spaces, opening widths and spaces). By reducing these dimensions, SRAM cell density can be increased. Second, reducing the width and spacing of the surface features frequently creates new problems. For example, as the spacing between adjacent lines is reduced, it typically becomes more difficult to reliably etch the lines. Finally, the typical SRAM cell 10 takes no advantage of the considerable wafer volume that underlies the cell area. Much of the silicon area is wasted by isolation areas that are formed between the active areas 60 and 64.

Several prior art inventions relate to SRAM cells and vertical FET devices. U.S. Pat. No. 6,117,722 to Wuu et al describes a SRAM device and method of manufacture using dual fill STI. U.S. Pat. No. 6,313,490 B1 to Noble teaches a SRAM memory cell based on a base-current mechanism. Vertical FET devices are used. U.S. Pat. No. 6,297,531 B2 to Armacost et al discloses a method to form vertical FET devices using epitaxial layers. A 6T SRAM cell is described in the technology. U.S. Pat. No. 6,137,129 to Bertin et al describes a method to form a latch comprising a pair of complimentary FET devices having directly coupled gates. The gate of the NFET device is coupled to the drain of the PFET device. The gate of the PFET device is coupled to the drain of the NFET device. The devices are formed using epitaxial deposition and share a common gate dielectric. A SRAM cell is disclosed in the technology. U.S. Pat. No. 4,890,144 to Teng et al shows a vertical FET formed in a trench. A SRAM cell is disclosed.

SUMMARY OF THE INVENTION

A principal object of the present invention is to provide an effective and very manufacturable memory device and method of fabrication thereof.

A further object of the present invention is to provide a digital latch in an integrated circuit device.

A yet further object of the present invention is to provide a digital latch comprising complimentary, vertical FET devices.

A yet further object of the present invention is to provide a SRAM cell based on a vertical FET, digital latch.

A yet further object of the present invention is to provide a SRAM cell capable of storing two, independent data bits.

A yet further object of the present invention is to provide a SRAM cell having a small layout area.

Another further object of the present invention is to provide a method to form a digital latch using vertical FET devices.

Another yet further object of the present invention is to provide a method that is compatible with a standard, CMOS process.

In accordance with the objects of this invention, a digital follower device is achieved. The device comprises an n-channel vertical FET device and a p-channel vertical FET device. Each vertical FET device comprises a vertical bulk region in a semiconductor substrate. The bulk region comprises a first doping type. A STI region is in the bulk region. A drain region is on a first side of the STI region. The drain region overlies the bulk region. The drain region comprises the first doping type. A gate region is on a second side of the STI region. The gate region comprises the first doping type. A voltage on the gate region controls a vertical channel in the bulk region. A buried region is between the gate region and the bulk region. The buried region comprises a second doping type. The n-channel FET device drain and the p-channel FET device drain are connected together. The n-channel FET device gate and the p-channel FET device gate are connected together.

Also in accordance with the objects of this invention, an SRAM cell device is achieved. The device comprises a digital latch. The digital latch comprises an n-channel vertical FET device and a p-channel vertical FET device. Each vertical FET device comprises a bulk region in a semiconductor substrate. The bulk region comprises a first doping type. A STI region is in the bulk region. A drain region is on a first side of the STI region. The drain region overlies the bulk region. The drain region comprises the first doping type. A gate region is on a second side of the STI region. The gate region comprises the first doping type. A voltage on the gate region controls a vertical channel in the bulk region. A buried region is between the gate region and the bulk region. The buried region comprises a second doping type. The n-channel FET device drain and gate and the p-channel FET device drain and gate are connected together to form a storage node for the digital latch device. A switch is used to controllably couple the storage node and a bit line.

Also in accordance with the objects of this invention, a SRAM cell device is achieved. The device comprises a first digital latch and a second digital latch. The first and second digital latches each comprise an n-channel vertical FET device and a p-channel vertical FET device. Each vertical FET device comprises a bulk region in a semiconductor substrate. The bulk region comprises a first doping type. A STI region is in the bulk region. A drain region is on a first side of the STI region. The drain region overlies the bulk region. The drain region comprises the first doping type. A gate region is on a second side of the STI region. The gate region comprises the first doping type. A voltage on the gate region controls a vertical channel in the bulk region. A buried region is between the gate region and the bulk region. The buried region comprises a second doping type. The n-channel FET device drain and gate and the p-channel FET device drain and gate are connected together to form a storage node for the digital latch device. A switch is used to controllably couple the storage node and a bit line.

Also in accordance with the objects of this invention, a method to form digital follower devices is achieved. Each digital follower device comprises an n-channel vertical FET and a p-channel vertical FET device. The method comprises forming n-channel vertical FET devices and p-channel vertical FET devices. The vertical FET devices are formed by a method comprising forming STI regions in a semiconductor substrate. Bulk regions of a first doping type are formed in the semiconductor substrate. Ions are implanted into the bulk regions on a first side of the STI regions to thereby form drain regions. The drain regions comprise the first doping type. The drain regions overlie the bulk regions. Ions are implanted into the bulk regions on a second side of the STI regions to form gate regions. The gate regions comprise the first doping type. Voltages on the gate regions control vertical channels in the bulk regions. Ions are implanted into the bulk regions on the second sides of the STI regions to form buried regions between the gate regions and the bulk regions. The buried regions comprise a second doping type. Connective lines are formed to connect together the n-channel FET device drain regions and the p-channel FET device drain regions and to connect together the n-channel FET device gate regions and the p-channel FET device gate regions.

BRIEF DESCRIPTION OF THE DRAWINGS

In the accompanying drawings forming a material part of this description, there is shown:

FIGS. 3 through 16c illustrate a first preferred embodiment of the present invention showing a method of forming vertical FET devices and disclosing a digital follower device.

DESCRIPTION OF THE PREFERRED EMBODIMENTS

Figure 1:
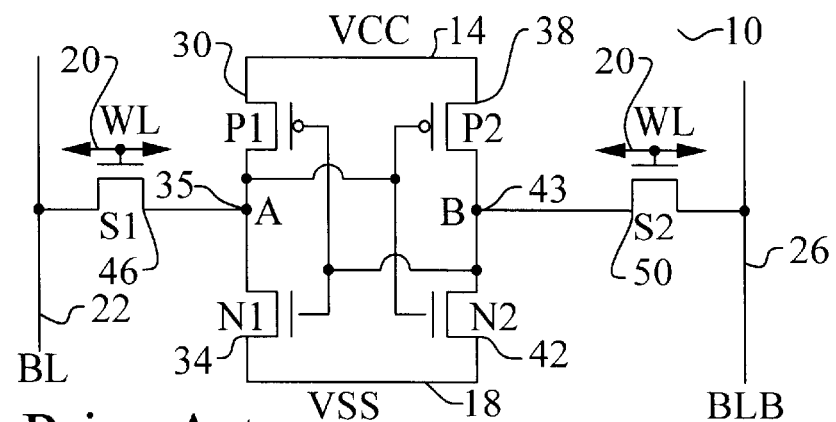
FIGS. 1 and 2 illustrate a prior art SRAM cell in schematic form and in top layout view.

The preferred embodiments of the present invention disclose a memory device. In particular, a digital latch comprising vertical FET transistors is disclosed. This digital latch is used to form unique SRAM cells. A method of forming the digital latch is also disclosed. It should be clear to those experienced in the art that the present invention can be applied and extended without deviating from the scope of the present invention.

Referring now to FIGS. 3 through 16c a first preferred embodiment of the present invention showing a method of forming vertical FET devices in the creation of a novel digital follower device is illustrated. Several important features of the present invention are shown and discussed below. Note that the following description and illustrations focus only on the formation of the vertical FET devices. Typical surface-type, or lateral, CMOS-devices (n-channel and p-channel MOSFETs) can be easily added to the disclosed process by methods well-known in the art. Therefore, the formation steps for the surface-type CMOS devices are not illustrated. A substrate 100 is provided. The substrate 100 preferably comprises a semiconductor material, such as silicon and, more preferably, comprises doped, monocrystalline silicon. A pad oxide layer 104 is next formed overlying the surface of the substrate 100. The pad oxide layer 104 is formed, for example, by oxidizing the substrate 100. Preferably, the pad oxide layer 104 is formed to a thickness of between about 80 Angstroms and about 150 Angstroms. Next, a silicon nitride layer 108 is formed overlying the pad oxide layer 104. The silicon nitride layer 108 is deposited, for example, using a chemical vapor deposition (CVD)

process. Preferably, the silicon nitride layer 108 is deposited to a thickness of between about 800 Angstroms and about 1500 Angstroms. The use of the silicon nitride layer 108 and the pad oxide layer 104 is not critical to the teachings of this invention but is indicative of a preferred method of forming the isolation regions, and particularly, of forming isolation regions having differing dielectric properties as will be seen.

Referring now to FIG. 4, an active area masking layer 112 is formed overlying the silicon nitride layer 108. The masking layer 112 may comprise, for example, a photoresist layer 112 coated overlying the silicon nitride layer 108. The photoresist layer 112 is exposed to actinic light through a mask and then developed to form a patterned masking layer 112 as shown. Following the masking layer 112 definition, the silicon nitride layer 108, the pad oxide layer 104, and the substrate 100 are etched. Trenches 114 and 116 are formed in the substrate 100 where exposed by the masking layer 112. Standard, shallow trench isolation region trenches 116 and vertical gate trenches 114 can thereby be formed simultaneously. The masking layer 112 is then removed and the wafer surface is cleaned. Alternatively, a second masking and etching sequence may be added so that deeper trenches may be formed in areas of planned vertical FET devices while shallower trenches may be formed for surface CMOS devices on a single integrated circuit device.

Referring now to FIG. 5, a liner oxide layer 120 of between about 100 Angstroms and about 200 Angstroms may be formed to line the trenches 114 and 116 prior to deposition of a first trench dielectric layer 124. Preferably, the first trench dielectric layer 124 comprises a low k-value dielectric material that is particularly suited for isolating between surface CMOS active areas. For example, the first trench dielectric layer 124 may be deposited using a high density plasma, CVD (HDP CVD). Alternatively, a fluorinated silicate glass (FSG) may be used for the first trench dielectric layer 124.

Figure 10:
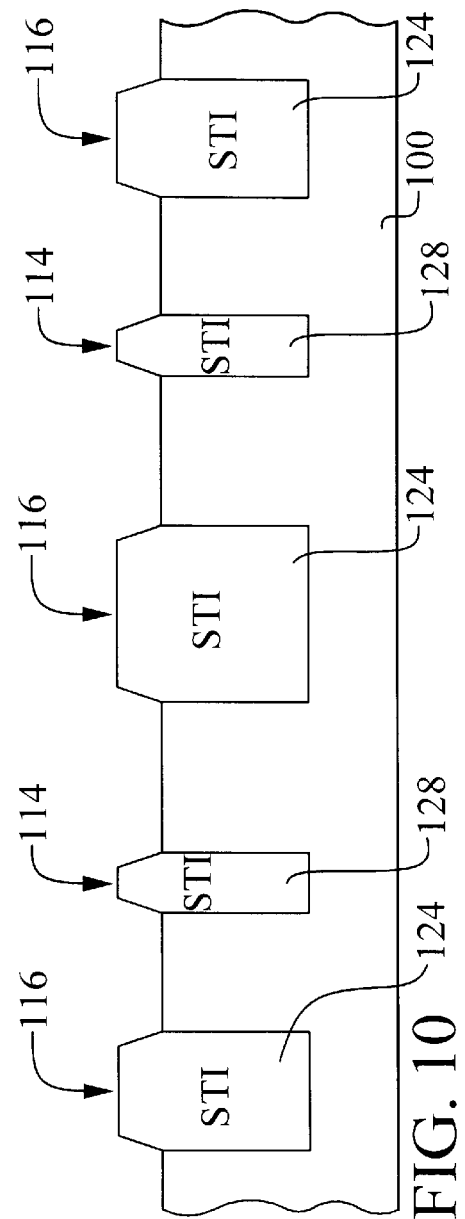

Referring now to FIG. 6, the first trench dielectric layer 124 is then planarized. Preferably, the planarization is performed using a chemical mechanical polish (CMP) step as is known in the art. Alternatively, a differing planarization process could be used. As a further alternative, if a single type of trench dielectric material 124 is used for all of the STI regions 114 and 116, then the'silicon nitride layer 108 and the pad oxide layer 104 are next etched away to complete the formation of all the STI regions. 114 and 116 as illustrated in FIG. 10. However, in the preferred embodiment, a second trench dielectric material will be selectively formed in the STI regions 114 that will be used as gate dielectric regions for the vertical FET devices.

Referring now therefore to FIG. 7, a second active area masking layer 126 is formed overlying the silicon nitride layer 108. The second active area masking layer 126 is patterned to cover standard STI regions 116 while exposing planned gate regions 114 for the vertical FET devices. The masking layer 126 may comprise a photoresist layer that is patterned as described above. The first trench dielectric layer 124 is then removed from the gate trenches 114 by etching.

Referring now to FIG. 8, a second trench dielectric layer 128 is now deposited overlying the silicon nitride layer 108 and filling the gate trenches 114. Once again, an oxide liner layer, not shown, may be grown prior to the deposition of the second trench dielectric layer 128. This second trench dielectric layer 128 preferably comprises a high k dielectric material that will enhance the field penetration performance of the STI gates 114. For example, the second trench dielectric layer may comprise a metal oxide, such as tantalum oxide or aluminum oxide. Alternatively, silicon nitride may be used for the second trench dielectric layer 128.

Figure 9:
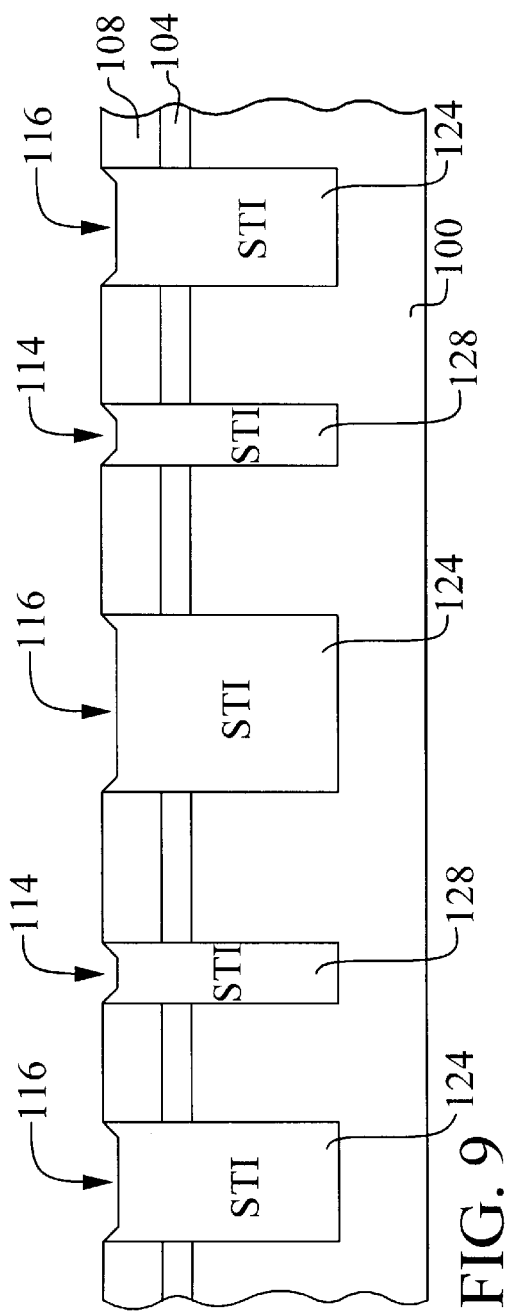

Referring now to FIG. 9, the second trench dielectric layer 128 is planarized. Preferably, the second trench dielectric layer 128 is planarized using CMP. Referring again to FIG. 10, the silicon nitride layer 108 and the pad oxide layer 104 may now be etched away to complete the STI regions 116 and 114. This method of forming STI regions 114 and 116 having different dielectric materials is particularly useful in the present invention. The standard STI regions 116 use a dielectric material 124 with a low k value to thereby optimize the isolation capability. The gate STI regions 114 use a dielectric material 128 with a high k value to thereby optimize the gate performance of the vertical FET device as will be demonstrated below.

Figure 11:
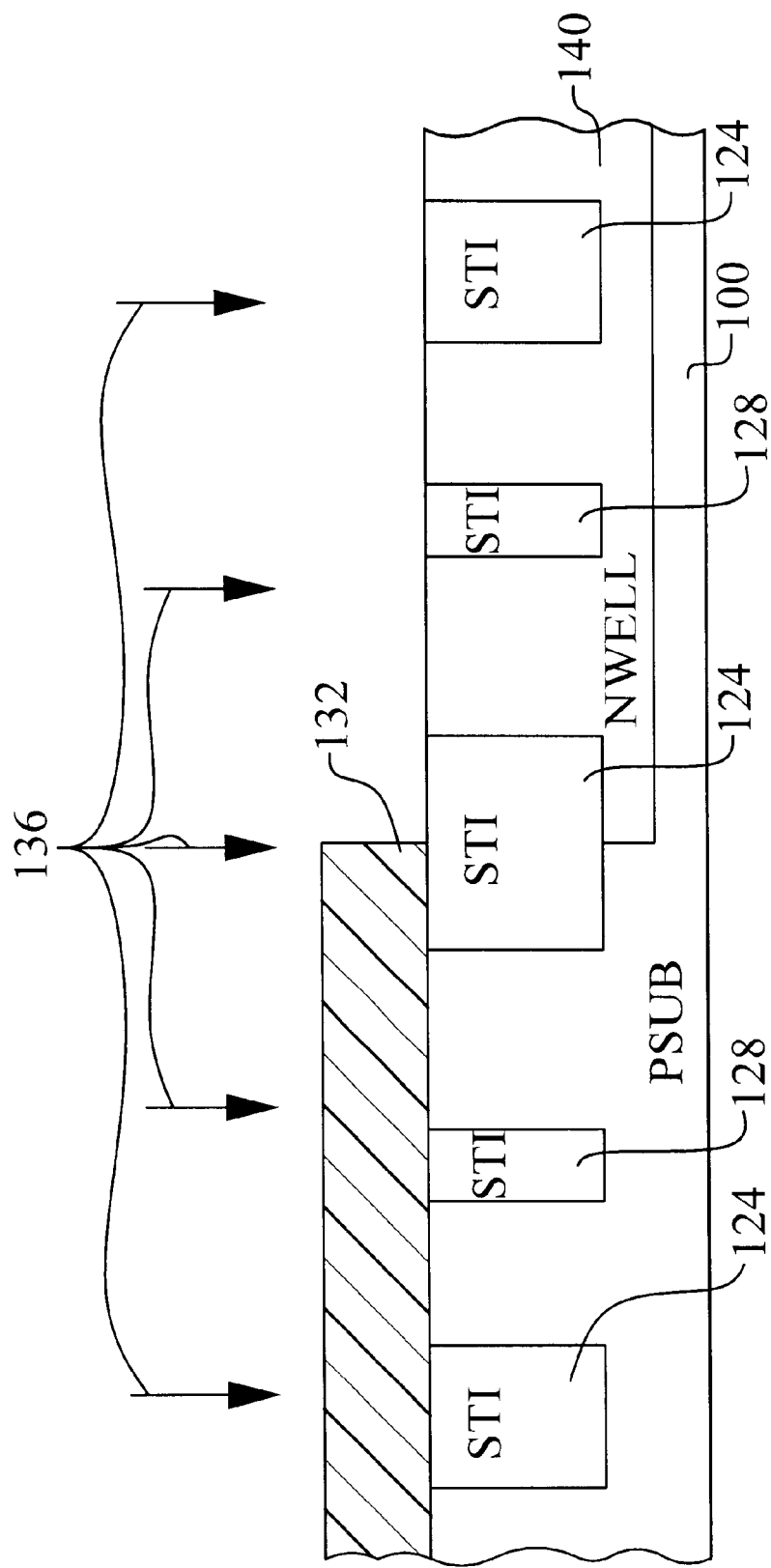

Referring now to FIG. 11, as an important step in the present invention, bulk regions 140 are formed in the semiconductor substrate 100. In the preferred embodiment, the semiconductor substrate 100 comprises a lightly p-type doping (PSUB). The PSUB forms the bulk region for planned p-channel vertical FET devices. The n-channel bulk region 140 comprises an n-type doped (NWELL) region 140 in the substrate 100. In the preferred embodiment, the NWELL region 140 is formed by selectively implanting ions 136 using an n-well masking layer 132. Alternatively, a separate p-well region may be formed by ion implantation so that both the p-type bulk regions 100 and the n-type bulk region 140 can be optimized for the device performance.

Figure 12:
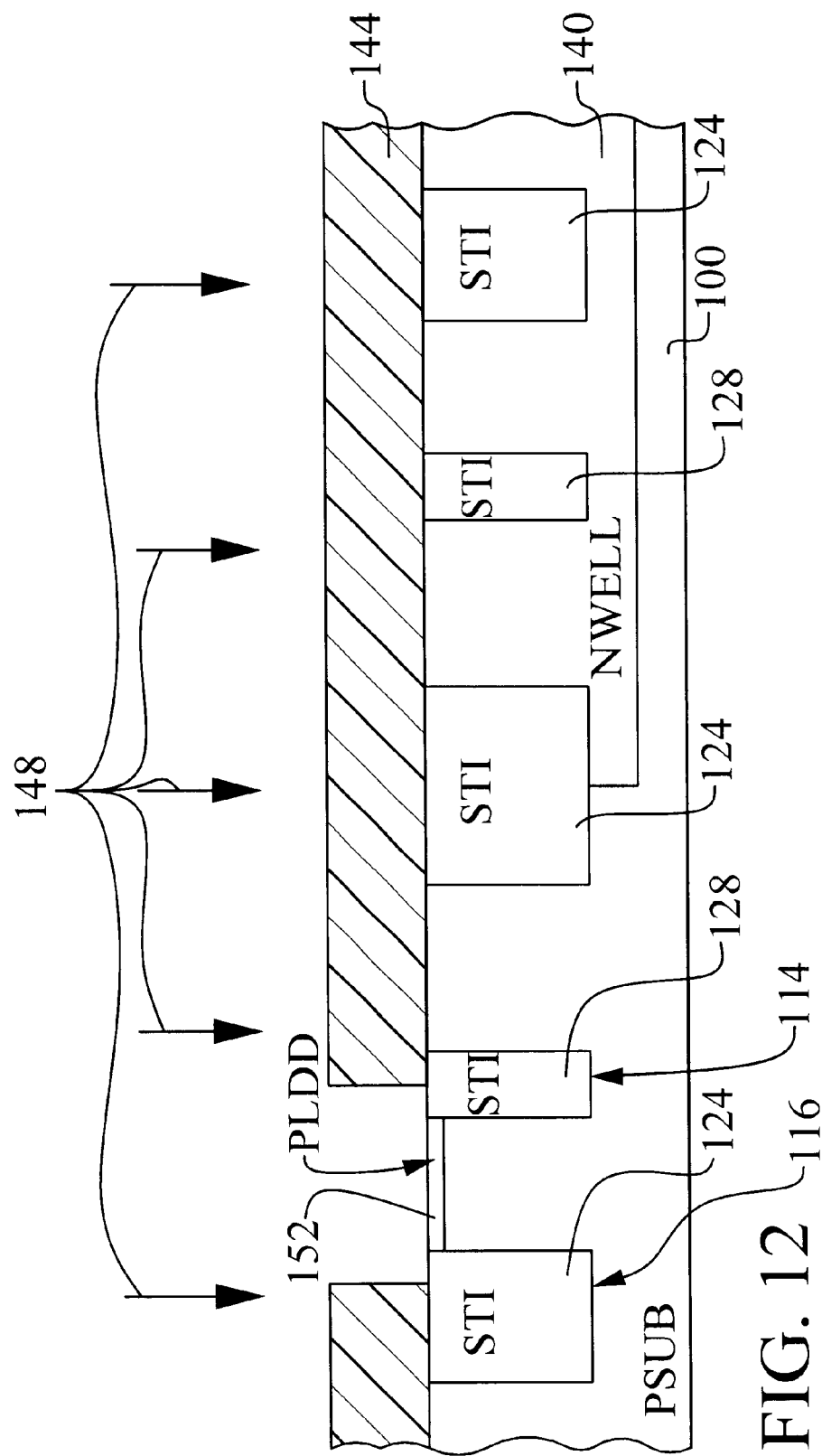

Referring now to FIG. 12, as an important feature, ions are implanted 148 into the p-type bulk region PSUB 100 on a first side of the gate STI regions 114 to thereby form drain regions 152. The drain regions 152 comprise the same doping type as the bulk. Preferably, a relatively thin, p-type region 152 is formed. More preferably, these drain regions 152 are formed using the same ion implantation 148 used for forming lightly doped drains (LDD) for surface PMOS devices in other areas of the integrated circuit device. The drain regions 152 so formed are preferably much shallower than the gate STI 114.

Figure 13:
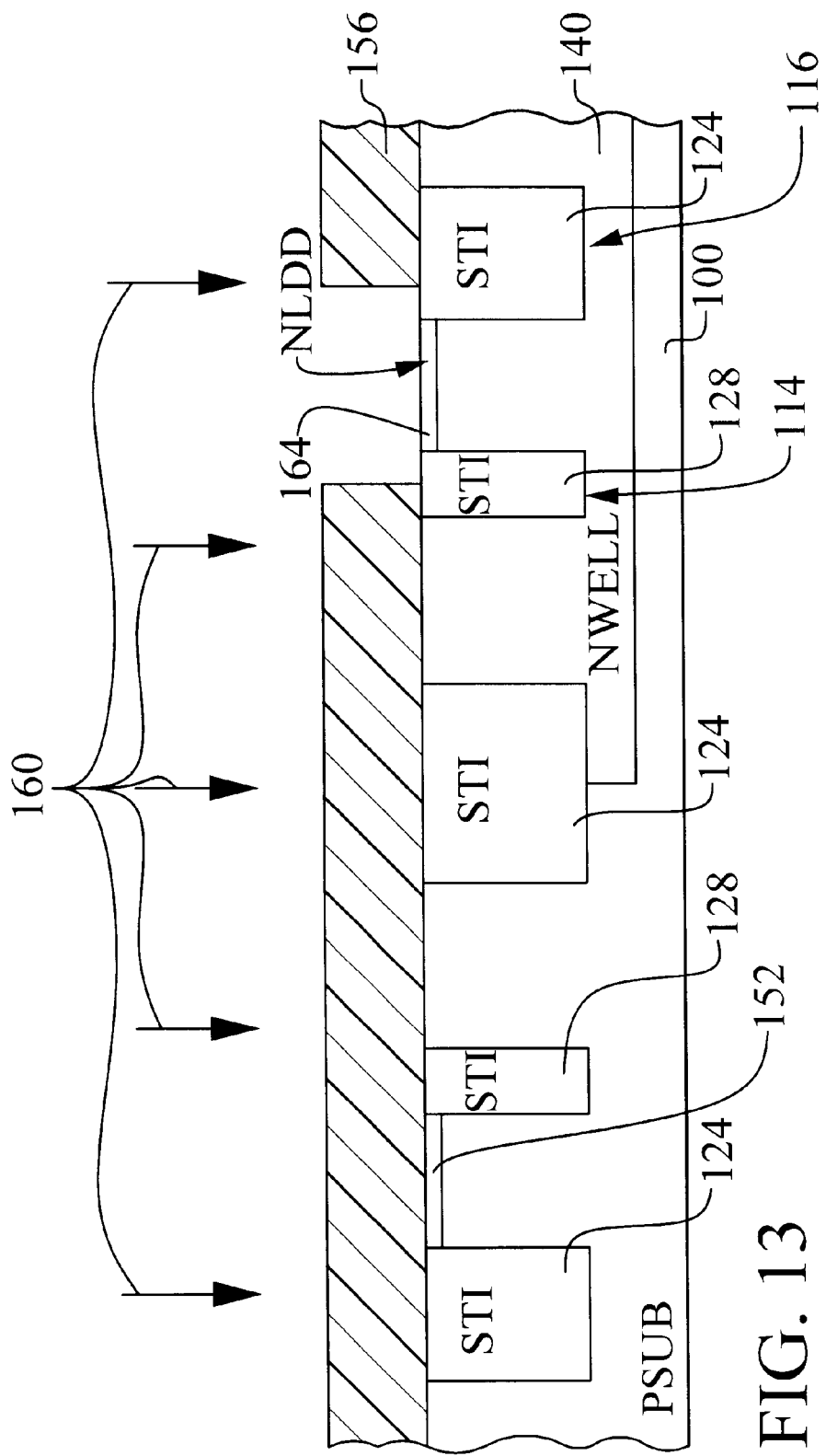

Referring now to FIG. 13, as an important feature, ions are implanted into the n-type bulk regions (NWELL) 140 to form drain regions 164 for the n-channel vertical FET devices. As described above, the drain regions 164 comprise the same doping type as the n-type bulk 140. Preferably, these drain regions 164 are formed using the same ion implantation 160 used for forming lightly doped drains (LDD) for surface NMOS devices in other areas of the integrated circuit device. The drain regions 164 so formed are preferably much shallower than the gate STI 114.

Figure 14:
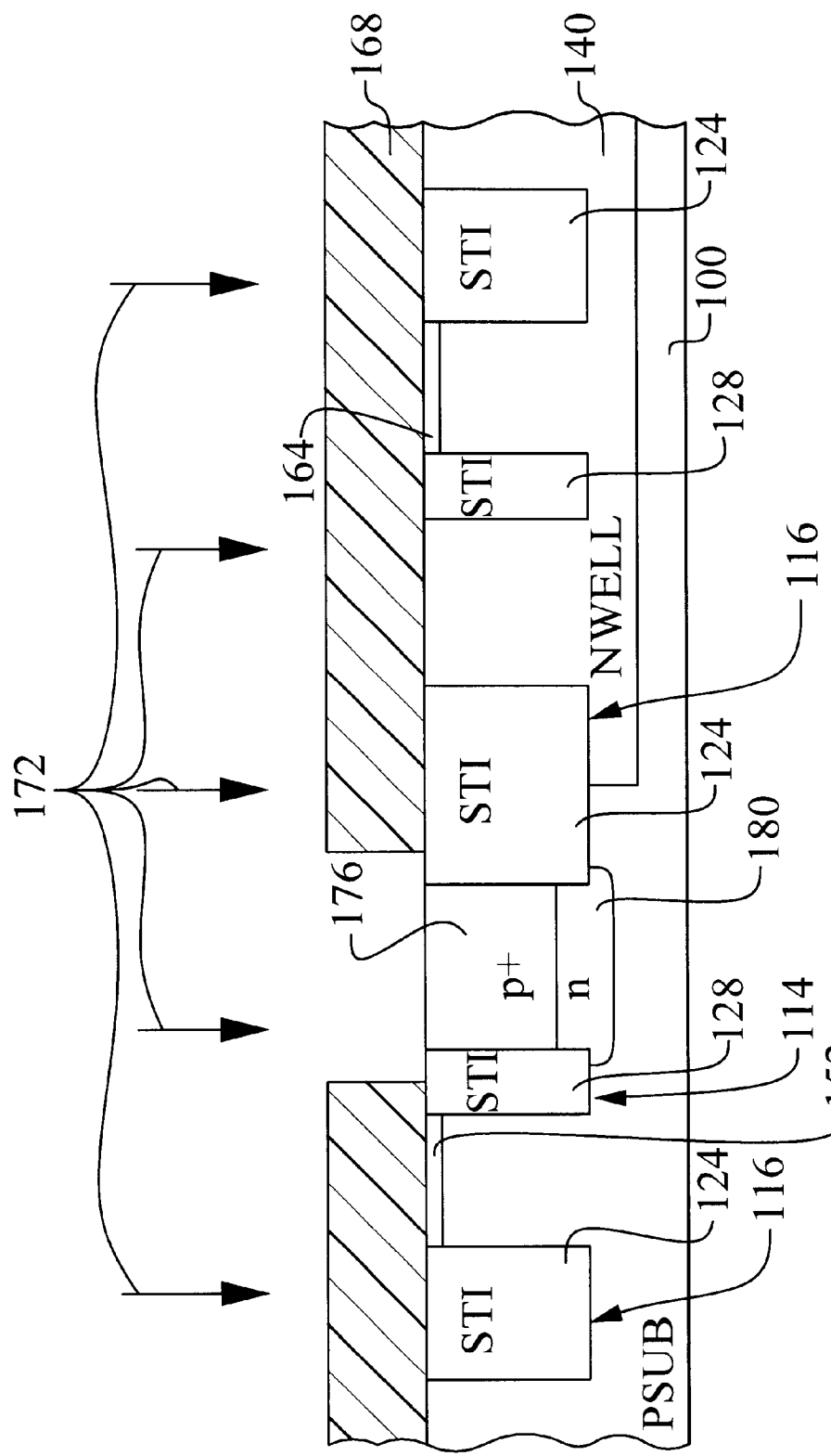

Referring now to FIG. 14, another important feature of the present invention is illustrated. Ions are implanted 172 into the p-type bulk regions 100 on a second side of the gate STI regions 114 to form gate regions 176. The gate regions 176 comprise the same doping type as the bulk. Preferably, the gate regions 176 comprise a heavy doping (P+). More importantly, the gate regions 176 are formed nearly as deep as the gate STI regions 114. As will be described below, voltages on the gate regions 176, control vertical channels in the bulk regions 100.

Ions are also implanted 172 into the p-type bulk regions 100 on the second side of the gate STI regions 114 to form buried regions 180 between the gate regions 176 and the bulk regions 100. The buried regions 180 comprise the opposite doping type of that used in the gate regions 176 or the bulk regions. More preferably, the buried regions 180 comprise an n-type doping and are formed below the p+ gate regions 176 such that the p+ gate regions 176 are isolated from the p-type bulk regions 100 by the buried regions 180. This preferred profile may be achieved by implanting 172 the n-type dopant ions for the buried region 180 at a higher relative energy than the p-type dopant ions for the gate region 176. The p-channel vertical FET devices are thereby completed.

Figure 15:
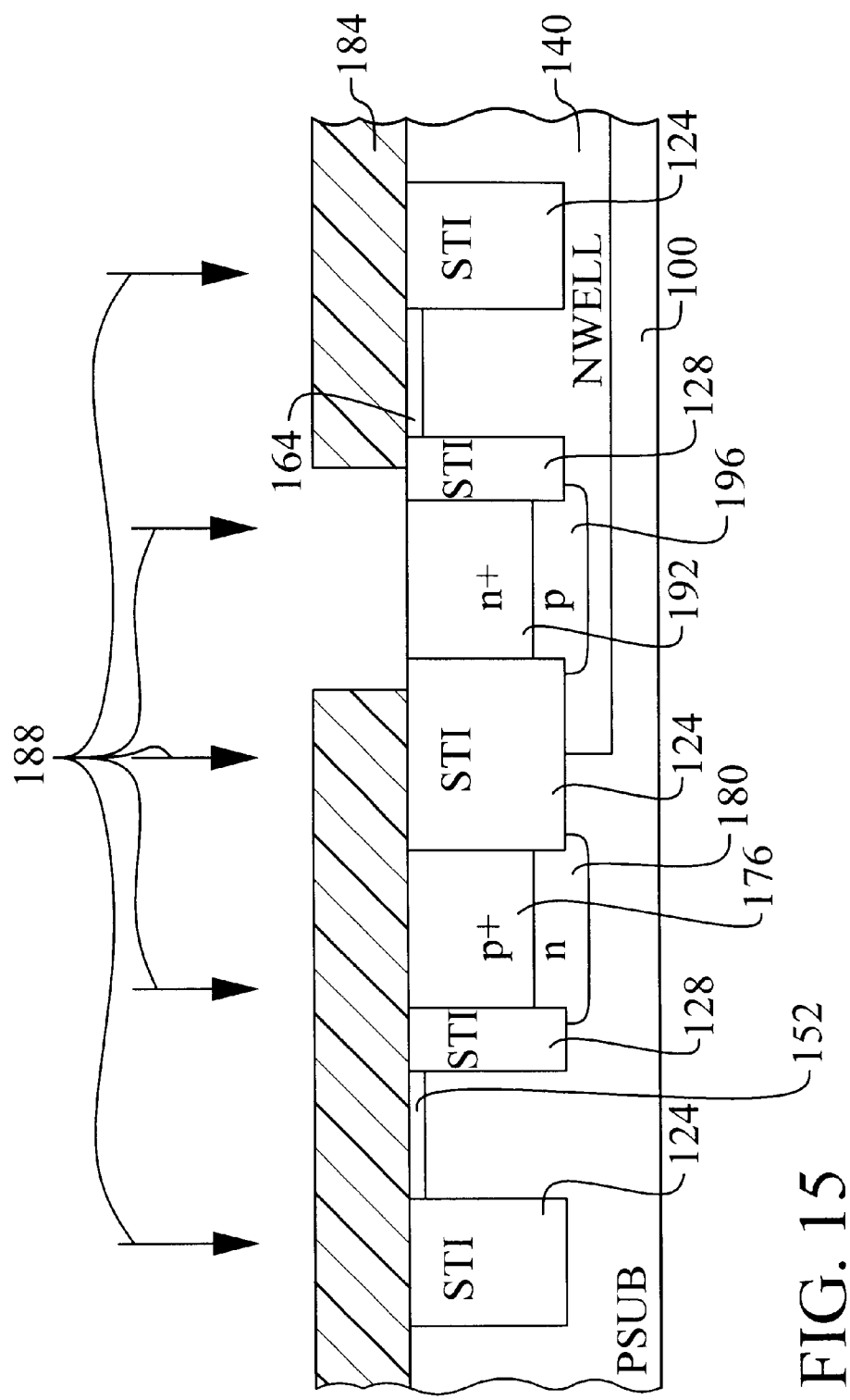

Referring now to FIG. 15, another important feature of the present invention is illustrated. Ions are implanted 188 into the n-type bulk regions (NWELL) 140 on a second side of the gate STI regions 114 to form gate regions 192. The gate regions 192 comprise the same doping type as the bulk 140. Preferably, the gate regions 192 comprise a heavy doping (N+). More importantly, the gate regions 192 are formed nearly as deep as the gate STI regions 114. As will be described below, voltages on the gate regions 192 control vertical channels in the bulk regions 140.

Ions are also implanted 188 into the n-type bulk regions 140 on the second side of the gate STI regions 114 to form buried regions 196 between the gate regions 192 and the bulk regions 140. The buried regions 196 comprise the opposite doping type of that used in the gate regions 192 and the bulk regions 140. More preferably, the buried regions 196 comprise a p-type doping and are formed below the n+ gate regions 192 such that the n+ gate regions 192 are isolated from the n-type bulk regions 140 by the buried p-type regions 196. This preferred profile may be achieved by implanting 188 the p-type dopant ions for the buried region 196 at a higher relative energy than the n-type dopant ions for the gate region 192. The n-channel vertical FET devices are thereby completed.

Figure 16A:
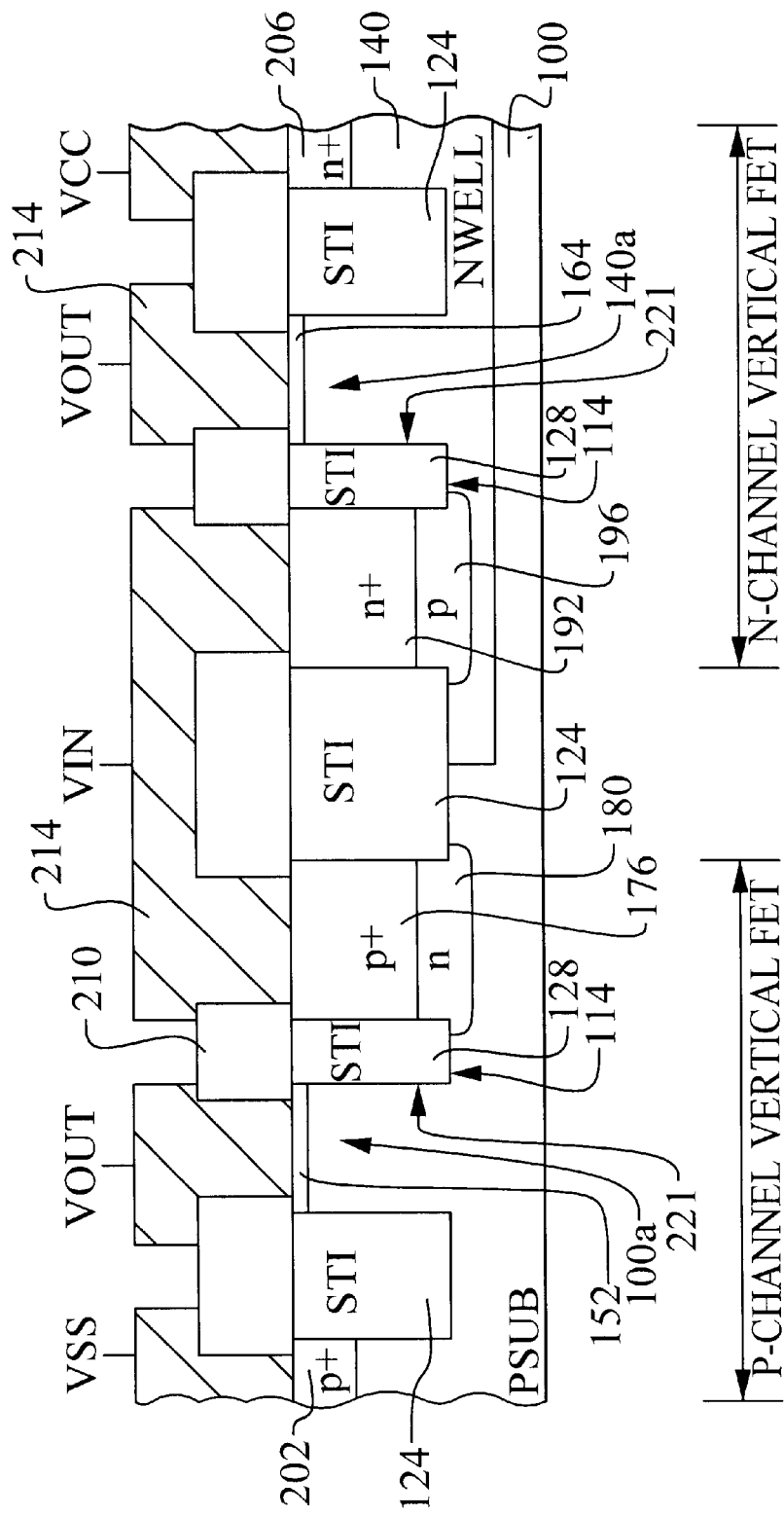

Referring now to FIG. 16a, additional p+ regions 202 may be formed in the p-type bulk 100 for coupling the p-type bulk to ground (VSS). These p+ regions 202 act as sources for the p-channel vertical FET devices. These p+ regions 202 may be formed with a separate masking step (not shown in FIG. 16a) for the source/drain ion implantation for the p-channel MOSFET transistors. Similarly, additional n+ regions 206 may be formed in the n-type bulk regions 140 for coupling the n-type well to a positive supply (VCC). These n+ regions 206 act as sources for the n-channel vertical FET devices. These n+regions 206 may be formed with a separate masking step (not shown in FIG. 16a) for the source/drain for the surface-type, n-channel MOSFET transistors. An interlevel dielectric layer 210 is deposited overlying the substrate 100. Contact openings are etched through the interlevel dielectric layer 210. A metal layer 214 is deposited overlying the interlevel dielectric layer 210 and filling the contact openings. The metal layer is patterned to create connective lines 214. Additional metal layers for interconnection may be formed. For example, up to eight metal levels may be formed in the current CMOS technology as is well known by those skilled in the art.

The vertical FET devices operate as field controlled resistors. For example, the p-channel vertical FET device comprises the shallow, p-type drain region 152, the p-type vertical channel region 100, as part of the p-type substrate 100, the p+ source region 202, the p+ gate region 176, and the gate dielectric comprising a STI region 128. The drain 152 is connected to VOUT, and the source is connected to VSS (ground). If a positive voltage is applied from VOUT to VSS, then the current flow from drain to source depends essentially on the resistance-of the bulk material (PSUB) 100. In a typical circumstance, a voltage applied to the gate node 176 would not alter this bulk resistance because the STI region 128 would be too wide and have a low k value. However, in the present invention, the STI region 128 is made narrow due to limitations of lithography tools used for patterning the trenches. For example, the STI region 114 inside the vertical FET may be less than about 0.15 microns wide in state of the art 0.15 micron CMOS technology. In addition, the STI dielectric material 128 preferably comprises a high k value material as discussed above. Therefore, a voltage forced onto the gate region 176 can cause charge accumulation or depletion at the bulk-to-STI vertical interface 221. Finally, the gate region 176 is made nearly as deep as the STI region 128. In this way, the gate region 176 controls a substantial length of the bulk resistor. If needed, the gate region 176 can be made in a deeper trench (as discussed in the prior art analysis above) so that the gate region can control the entire length of the vertical device.

For example, zero volts or a negative voltage on the p-channel gate region 176 will cause hole accumulation at the bulk-to-STI vertical interface 221. This will, in turn, reduce the resistance from the drain 152 to the source 202 such that the vertical FET is ON. Alternatively, a positive voltage on the p-channel gate region 176 will cause charge depletion or even an inversion layer of electrons at the bulk-to-STI vertical interface 221. In this case, the bulk resistance value will increase sufficiently or even to stop all current flow form drain to source when the depletion region is extended over the entire vertical FET channel 100a, and to result in an OFF state. In addition, the presence of the buried region 180 is critical to operation of the device. The n-type buried region electrically isolates the gate region 176 from the bulk region 100 such that the gate region 176 can attain a range of voltage levels independent of the bulk voltage. In this way, the gate 176 can be driven to a voltage less than the bulk region 100 to fully turn ON the device.

The n-channel vertical FET device operates by a similar principle. The device comprises an n-type drain 164, a vertical n-type channel region 140a as part of the NWELL bulk 140, an n+ source region 206, a STI region gate dielectric 128, and an n+ gate region 192. The source 206 is tied to the positive supply such that current flow from source 206 to drain 164 is proportional to the resistance mainly associated with the vertical channel region 140a. Zero volts, or a positive voltage on the gate region 192 with respect to the bulk region 140, will cause electron accumulation 221 and current flow in the FET device sufficient to describe the device as ON. Alternatively, if the gate region voltage 192 is negative with respect to the vertical channel region 140a, then the vertical channel region 140a will be depleted of charge such that the device will be OFF. The p-type buried region 196 allows the n+ gate region 192 to be driven to a voltage above the bulk 140 voltage (VCC) to thereby fully turn ON the device.

The connective metal lines 214 may be configured in several ways. A first preferred arrangement is to connect the gate region 176 of the p-channel vertical FET to the gate region 192 of the n-channel vertical FET to form an input node, VIN. Further, the drain region 152 of the p-channel vertical FET is connected to the drain region 164 of the n-channel vertical FET to form an output node VOUT. In this configuration, the complimentary, vertical FET pair forms a digital follower circuit as shown in FIG. 16c. In the digital follower circuit, the digital output voltage VOUT 228 follows the input voltage VIN 224. A low voltage level on VIN 224 causes the p-channel vertical FET to be ON and the n-channel vertical FET to be OFF. Therefore, the VOUT signal is pulled to the VSS, or low, level. Similarly, if VIN 224 is forced high, then the p-channel vertical FET is OFF and the n-channel vertical FET is ON. VOUT 228 is pulled to VCC, or high.

Figure 16B:
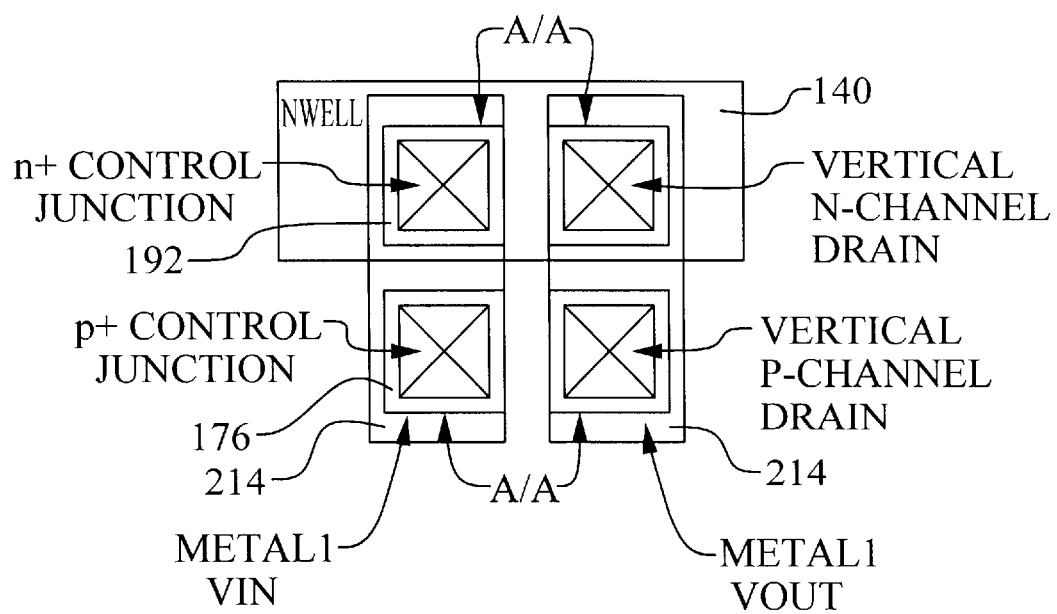
Figure 16C:
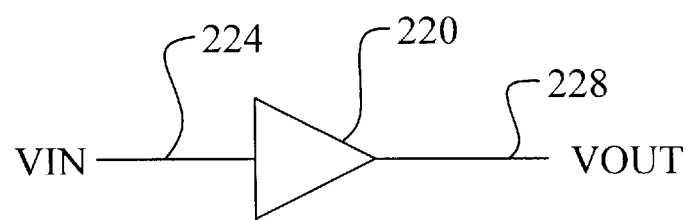

Referring now to FIG. 16b, a top view of the above described digital follower circuit is shown. The layout illustrates the very compact arrangement possible through the use of the vertical FET devices. Four closely spaced active areas are formed, a n+ control (or gate) junction 192, a vertical n-channel drain, a p+ control (or gate) junction 176, and a vertical p-channel drain. Each active area need only use the minimum active-to-active pitch. Metal lines 214 are laid out for the VIN line and for the VOUT line. The layout area achieved is at least ten times smaller than that required to form and connect two inverters in a standard CMOS digital follower.

Figure 17A:
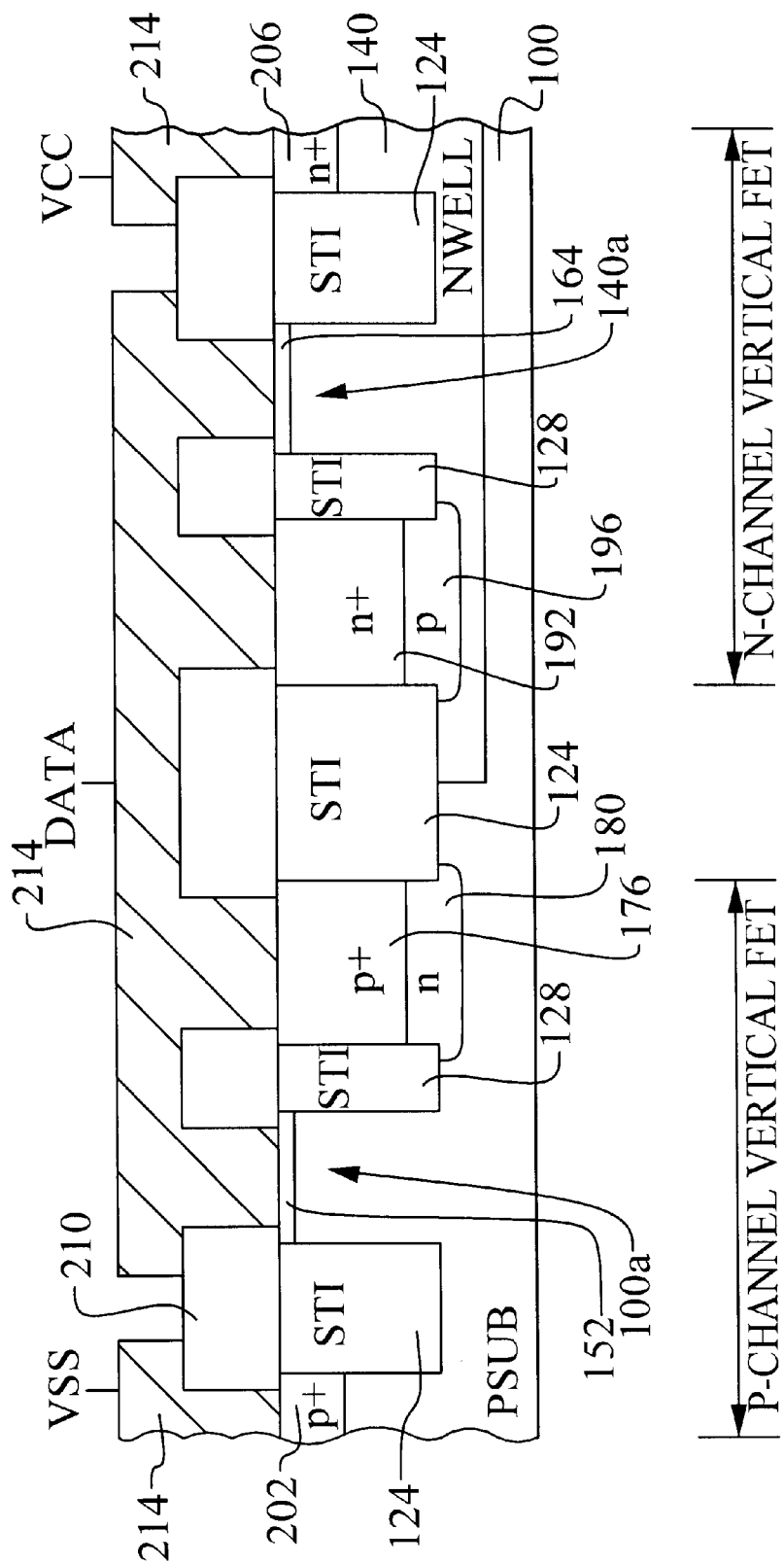
FIGS. 17a and 17b illustrate a second preferred embodiment of the present invention showing a digital latch device.
Figure 17B:
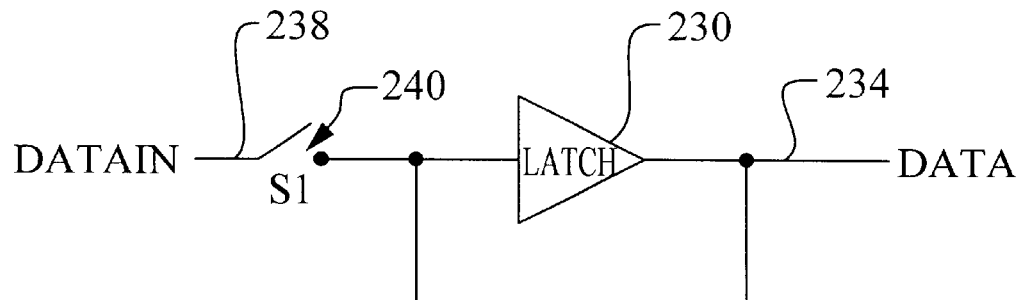

Referring now to FIG. 17a, a second preferred embodiment of the present invention is illustrated. In this embodiment, the drain regions 152 and 164 and gate regions 176 and 192 of both the p-channel vertical FET and the n-channel vertical FET are coupled together to form a single, storage node (DATA). Referring now to FIG. 17b, the second preferred embodiment circuit is a LATCH 230 where the input is connected to the output in a positive feedback loop. If an external voltage, high or low, is forced onto the DATA node 234, the latch circuit will sustain this same voltage when the voltage is removed.

In addition, the second preferred embodiment includes a switch S1 240 between signal DATAIN 238 and the storage node DATA 234. This switch controls access to the storage device for reading and for writing. Preferably, this switch S1 240 comprises a standard, surface-type MOSFET device, such as an NMOS transistor. For example, a polysilicon line can be formed overlying an active area coupling the DATAIN signal 238 to the DATA signal 234.

Figure 18A:
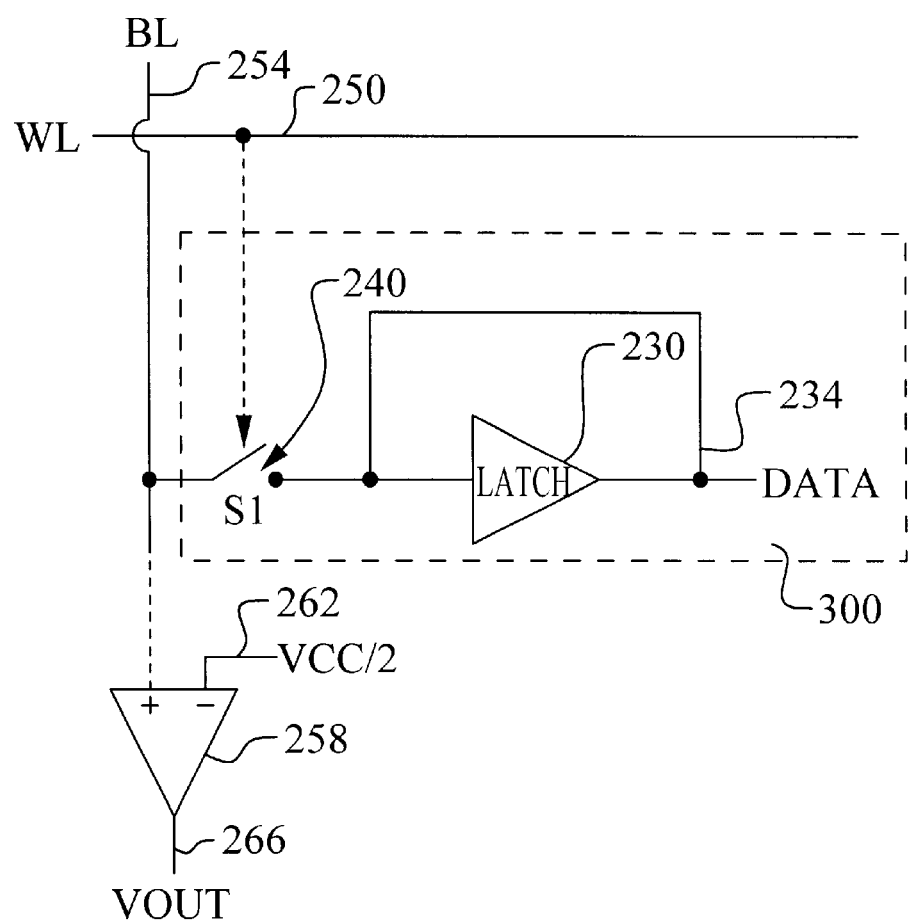
FIGS. 18a and 18b illustrate a third preferred embodiment of the present invention showing a SRAM device using a single digital latch.

Referring now to FIG. 18a, a third preferred embodiment of the present invention is illustrated. In this embodiment, the vertical FET, latch circuit is used as a SRAM cell 300. The SRAM cell 300 comprises the LATCH 230 with positive feedback and the switch S1 240. The switch S1 240 is connected between the bit line BL 254 signal to the cell 300 and the storage node DATA 234. The switch 240 is controlled by the word line WL 250 to the cell 300. Preferably, the gate to the MOS switch S1 240 is connected to the word line 250. A sense amplifier 258 is used to detect the state (high or low) of the SRAM cell DATA signal 234 via the bit line 254. The novel cell 300 can be easily sensed using a reference level of VCC/2 262 to generate the output VOUT 266. The novel SRAM cell 300 can store a single bit of data (0 or 1) as the high or low state of DATA 234. The cell 300 is truly static because it does not require refreshing.

Figure 2:
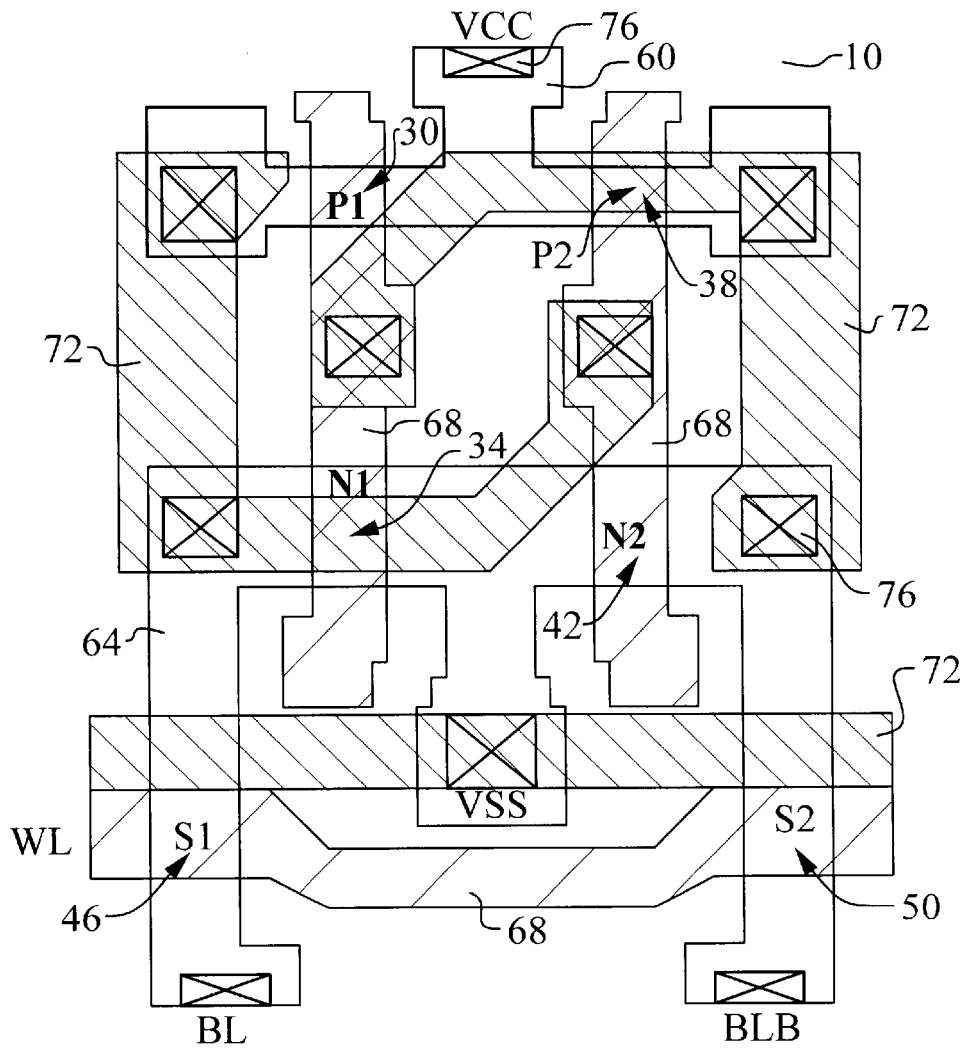
Figure 18B:
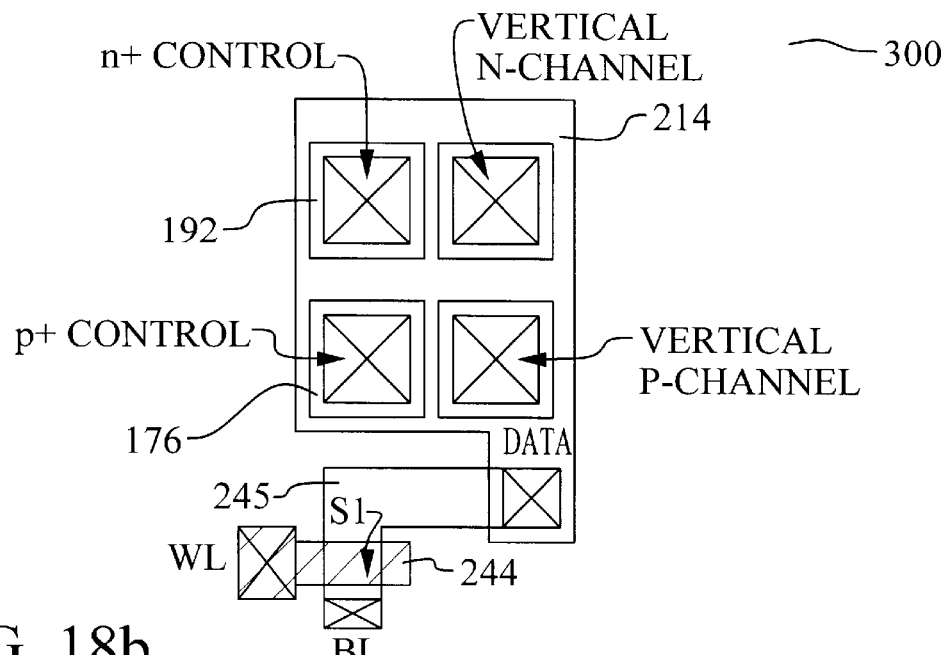

Referring now to FIG. 18b, the layout of the novel, single bit SRAM cell 300 is shown. As in the digital follower example, the basic cell requires only four, minimum sized active areas 176 and 192 for the latch. A single metal polygon 214 covers all four active area contacts. The MOS transistor S1 is formed by the intersection of the polysilicon layer 244 and the active area 245. The SRAM cell 300 has a very small footprint when compared to the exemplary six-transistor cell of FIG. 2. However, both SRAM cells in the prior art store only one bit of data.

Figure 19A:
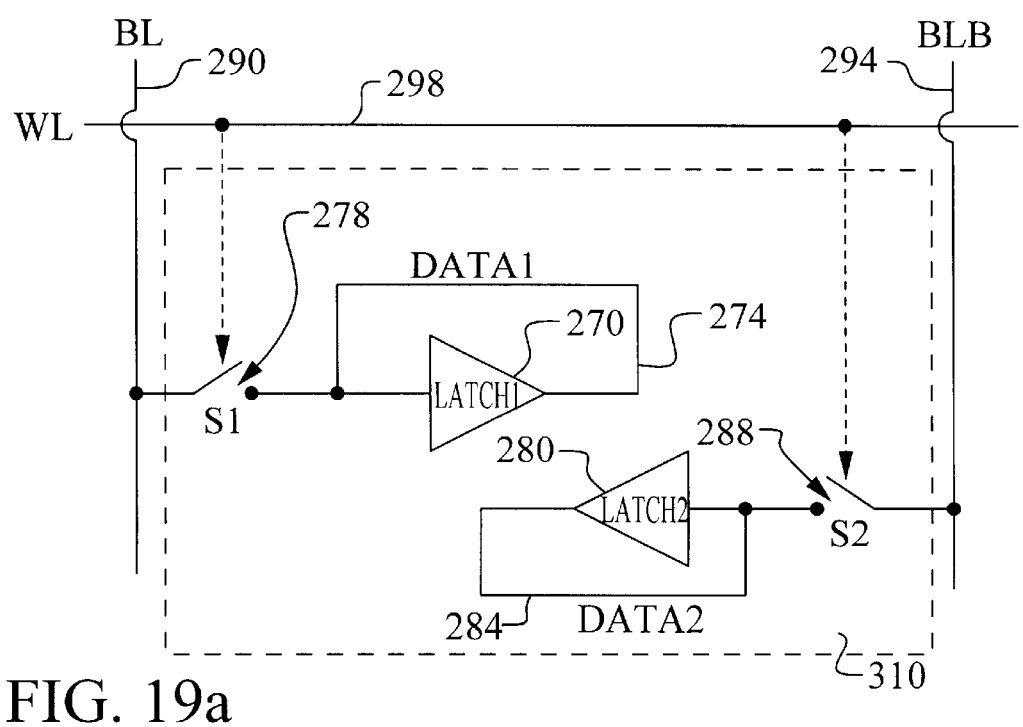
FIGS. 19a and 19b illustrate a fourth preferred embodiment of the present invention showing a SRAM device using two digital latches.
Figure 19B:
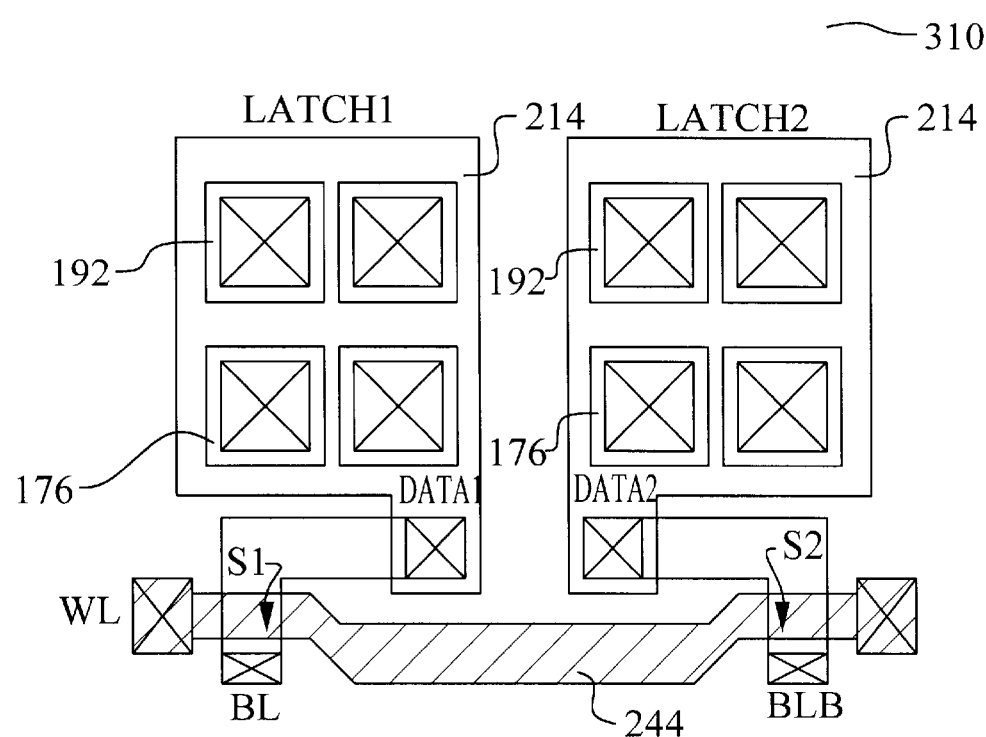

Referring now to FIG. 19a, a fourth preferred embodiment of the present invention is illustrated. In this embodiment, a two-bit SRAM cell 310 is shown. As illustrated in the exemplary, prior art SRAM cell of FIG. 1, the typical 6T SRAM has a bit line BL 290 and a bit line bar BLB 294 signal. Referring again to FIG. 19a, the fourth embodiment comprises two vertical FET latches 270 and 280. One latch 270 is connected to the BL 290 and the other latch 280 is connected to the BLB 294. The first latch 270, switch S1 278, and BL 290 are independent of the second latch 280, switch S2 288, and BLB 294. Therefore, each latch can store a single, independent data bit. The combined SRAM cell can store two independent data bits comprising four possible states (00, 01, 10, and 11). A single word line (WL) 298 can be used to control the switches S1 278 and S2 288 to access either data bit in the cell 310. Referring now to FIG. 19b, a top layout is similar to that of the single bit cell. Note that a single polysilicon line 244 couples the word line WL signal to the gates of both switches S1 and S2.

The advantages of the present invention may now be summarized. An effective and very manufacturable memory device and method of fabrication are achieved. A digital latch in an integrated circuit device is disclosed. The digital latch comprises complimentary, vertical FET devices. A single bit, SRAM cell based on vertical FET, digital latch is disclosed. A two bit, SRAM cell capable of storing two, independent data bits is also disclosed. The SRAM cell comprises a small layout area. A method to form a digital latch using vertical FET devices is disclosed. The method is compatible with a standard, CMOS process.

As shown in the preferred embodiments, the novel devices and methods of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form digital follower devices each comprising an n-channel vertical FET and a p-channel vertical FET device, said method comprising:
    forming n-channel vertical FET devices and p-channel vertical FET devices wherein said vertical FET devices are formed by a method comprising:
        forming STI regions in a semiconductor substrate;
        forming bulk regions of a first doping type in said semiconductor substrate;
        implanting ions into said bulk regions on a first side of said STI regions to thereby form drain regions wherein said drain regions comprise said first doping type and wherein said drain regions overlie said bulk regions;
        implanting ions into said bulk regions on a second side of said STI regions to form gate regions wherein said gate regions comprise said first doping type and wherein voltages on said gate regions control vertical channels in said bulk regions; and
        implanting ions into said bulk regions on said second side of said STI regions to form buried regions between said gate regions and said bulk regions wherein said buried regions comprise a second doping type; and
    forming connective lines to connect together said n-channel FET device drain regions and said p-channel FET device drain regions and to connect together said n-channel FET device gate regions and said p-channel FET device gate regions.

2. The method according to claim 1 wherein said p-channel FET device bulk regions comprises said semiconductor substrate and wherein said n-channel FET device bulk regions comprises an n-well region in said semiconductor substrate.

3. The method according to claim 1 wherein said n-channel FET device gate regions comprises and n+ region and said n-channel FET device buried regions comprises a p+ region.

4. The method according to claim 1 wherein said p-channel FET device gate regions comprise a p+ region and said p-channel FET device buried regions comprise a n+ region.

5. The method according to claim 1 wherein said step of forming STI regions comprises:

etching trenches in said semiconductor substrate for said STI regions and for other STI regions;

selectively filling said trenches for said STI regions with a first dielectric layer and said trenches for said other STI regions with a second dielectric layer wherein said first dielectric layer comprises a lower dielectric constant than said second dielectric layer; and planarizing said first and second dielectric layers to complete said STI regions and said other STI regions.

6. The method according to claim 1 wherein both said drain regions and both said gate regions are connected together to form a storage node.

7. The method according to claim 6 further comprising:

depositing a polysilicon gate layer overlying said semiconductor substrate; and patterning said polysilicon layer to form gates for MOSFET devices wherein said MOSFET devices comprise switches to controllably connect said storage node and a bit line.

* * * * *